United States Patent
Zhang et al.

(10) Patent No.: US 6,632,031 B1
(45) Date of Patent: Oct. 14, 2003

(54) SHUNT TRANSIENT VOLTAGE REGULATOR IN A PROCESSOR PACKAGE, METHOD OF MAKING SAME, AND METHOD OF USING SAME

(75) Inventors: Michael T. Zhang, Portland, OR (US); Michael W. Eisele, Paradise Valley, AZ (US); Robert T. Carroll, Andover, MA (US); William B. Pohlman, Phoenix, AZ (US); Kenneth A. Ostrom, Palos Verde, CA (US)

(73) Assignees: Intel Corporation, Santa Clara, CA (US); Primarion, Inc., Tempe, AZ (US)

( * ) Notice: Subject to any disclaimer, the term of this patent is extended or adjusted under 35 U.S.C. 154(b) by 0 days.

(21) Appl. No.: 10/109,312

(22) Filed: Mar. 28, 2002

(51) Int. Cl.[7] ............................................... G06F 13/42
(52) U.S. Cl. ..................... 395/500; 395/550; 395/309
(58) Field of Search ................. 395/550, 500, 395/309

(56) References Cited

U.S. PATENT DOCUMENTS

| | | | | |
|---|---|---|---|---|
| 5,325,043 A | * | 6/1994 | Parro | 322/23 |
| 5,629,608 A | * | 5/1997 | Budelman | 323/268 |
| 5,694,028 A | * | 12/1997 | Salmonson et al. | 323/273 |
| 5,694,297 A | * | 12/1997 | Smith et al. | 361/785 |
| 5,946,470 A | * | 8/1999 | Neal et al. | 703/21 |
| 5,984,728 A | * | 11/1999 | Chen et al. | 439/620 |
| 6,262,566 B1 | * | 7/2001 | Dinh | 323/282 |
| 6,288,919 B1 | * | 9/2001 | Jain | 363/89 |
| 6,346,743 B1 | * | 2/2002 | Figueroa et al. | 257/723 |
| 6,359,783 B1 | * | 3/2002 | Noble | 361/704 |
| 6,360,431 B1 | * | 3/2002 | Harrison et al. | 29/830 |
| RE37,708 E | * | 5/2002 | Danstrom | 323/284 |
| 6,414,469 B1 | * | 7/2002 | Zhou et al. | 323/272 |

* cited by examiner

*Primary Examiner*—Bao Q. Vu
(74) *Attorney, Agent, or Firm*—Schwegman, Lundberg, Woessner & Kluth, P.A.

(57) ABSTRACT

A shunt voltage regulator for a processor is disposed on the processor package. The shunt voltage regulator responds to AC transients. One embodiment includes a DC power converter voltage regulator that is disposed off the processor package, and that is optimized for DC power conversion. Another embodiment includes a method of improving fabrication yield for a packaged processor.

28 Claims, 7 Drawing Sheets

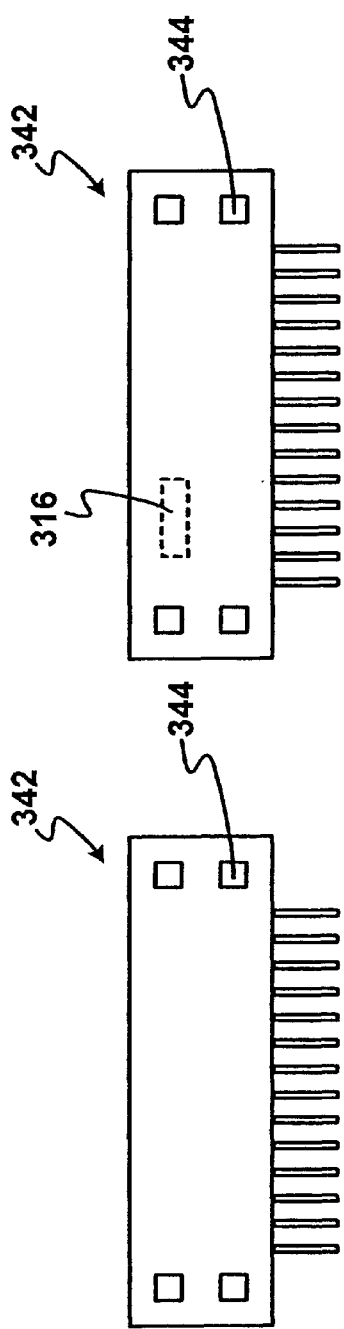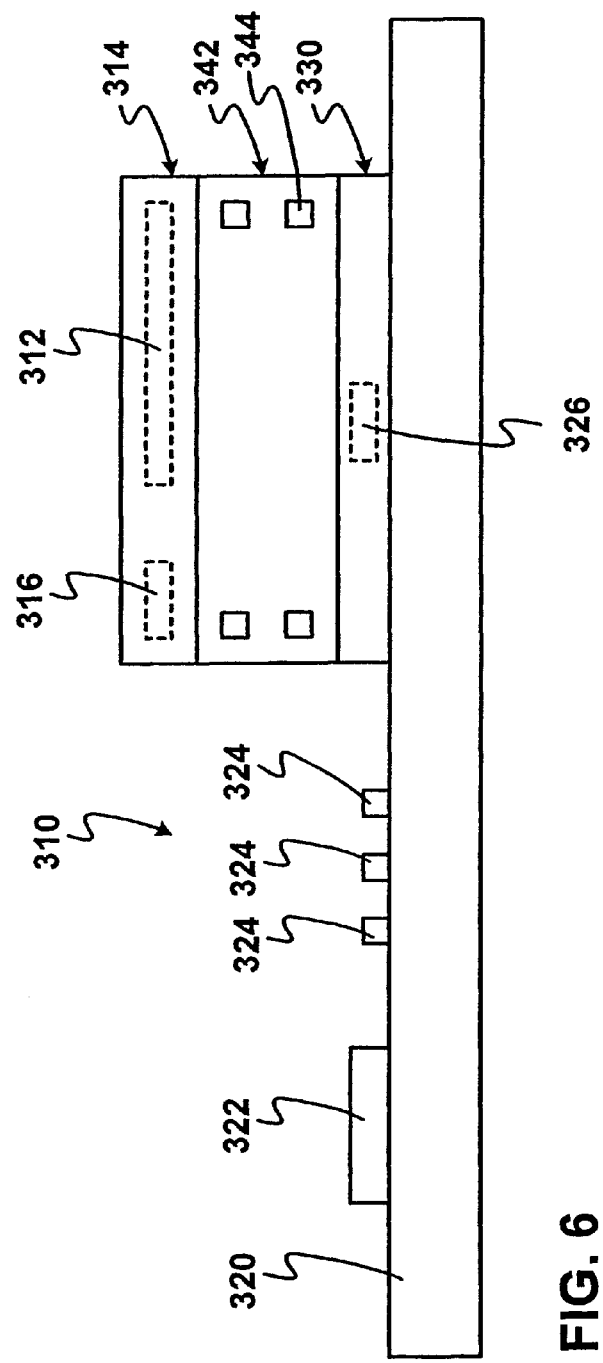

SHUNT TRANSIENT VOLTAGE REGULATOR IN A PROCESSOR PACKAGE, METHOD OF MAKING SAME, AND METHOD OF USING SAME

TECHNICAL FIELD

One embodiment of the present invention relates to a microelectronic device voltage regulator. More particularly, an embodiment relates to an on-package transient voltage regulator. In particular, one embodiment relates to an on-package transient voltage regulator that is coupled to a processor with an off-package DC voltage converter.

BACKGROUND INFORMATION

Description of Related Art

Power regulation for a microelectronic device such as a processor must include a steady voltage and an ability to respond to dynamic current demands of the processor. For example, when processor activity intensifies, a higher current demand causes a transient behavior in the processor unless it is met within the clock cycle of the processor. On the other hand, a lower current demand causes a transient behavior in the processor unless it is likewise responded to.

In order to respond appropriately to a transient current demand, a collection of decoupling capacitors is disposed in serial groups relative to the processor location. The closer the capacitor type is to the processor, the faster response it has. A high-performance capacitor is usually a ceramic device that is more expensive than other capacitors. However, the fastest capacitors can hold only a small amount of charge relative to the longer-term, but still transient needs of the processor. These high-performance capacitor types include what is called a land-side capacitor (LSC) or a die-side capacitor (DSC), among others. In some instances, the capacitor structure is identical for an LSC and a DSC. In some instances, the capacitor structures differ depending upon their location. The farther the capacitor type is from the processor, the slower response it has, but the greater capacity it bears.

In addition to a transient current demand regulation scheme, the processor also needs to draw from available voltage and convert it to an operating voltage (Vcc) that is lower than the available voltage. A voltage converter ordinarily generates a significant amount of heat that adds to the overall cooling demand for a processor platform.

BRIEF DESCRIPTION OF THE DRAWINGS

In order to understand the manner in which embodiments of the present invention are obtained, a more particular description of various embodiments of the invention briefly described above will be rendered by reference to the appended drawings. Understanding that these drawings depict only typical embodiments of the invention that are not necessarily drawn to scale and are not therefore to be considered to be limiting of its scope, the embodiments of the invention will be described and explained with additional specificity and detail through the use of the accompanying drawings in which:

FIG. 5A is an elevational view of an interposer including a decoupling capacitor according to an embodiment;

FIG. 5B is an elevational view of an interposer including a decoupling capacitor and a shunt, transient voltage regulator according to an embodiment;

FIG. 6 is an elevational view of an apparatus according to an embodiment;

DETAILED DESCRIPTION

The following description includes terms, such as upper, lower, first, second, etc. that are used for descriptive purposes only and are not to be construed as limiting. The embodiments of a device or article of the present invention described herein can be manufactured, used, or shipped in a number of positions and orientations. The terms "die" and "processor" generally refer to the physical object that is the basic workpiece that is transformed by various process operations into the desired integrated circuit. A die is typically made of semiconductive material that has been singulated from a wafer after integrated processing. Wafers may be made of semiconducting, non-semiconducting, or combinations of semiconducting and non-semiconducting materials.

Reference will now be made to the drawings wherein like structures will be provided with like reference designations. In order to show the structures of embodiments of the present invention most clearly, the drawings included herein are diagrammatic representations of inventive articles. Thus, the actual appearance of the fabricated structures, for example in a photomicrograph, may appear different while still incorporating the essential structures of embodiments of the present invention. Moreover, the drawings show only the structures necessary to understand the embodiments of the present invention. Additional structures known in the art have not been included to maintain the clarity of the drawings.

One embodiment of the present invention relates to an on-processor package shunt voltage regulator.

Figure 1:
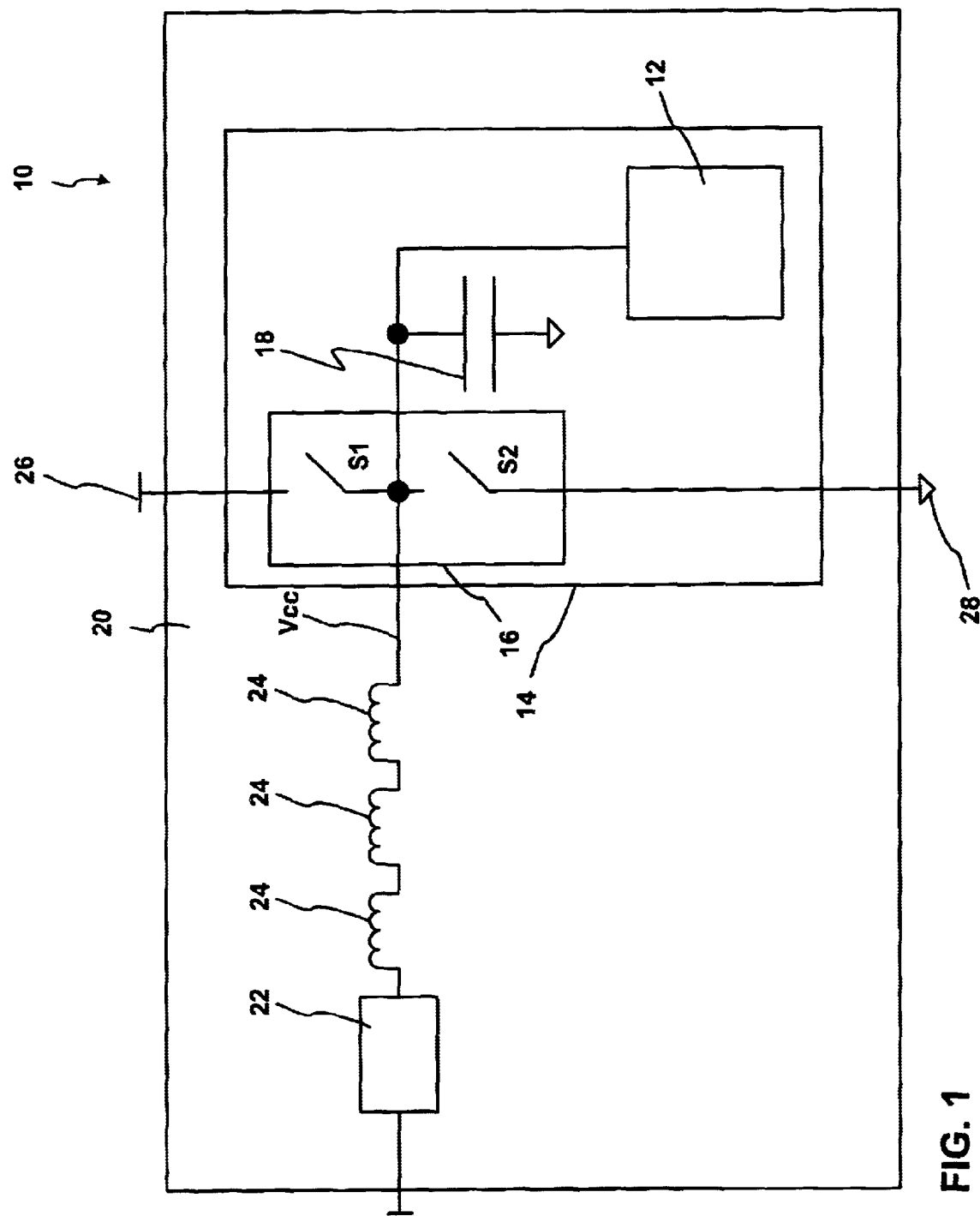
FIG. 1 is a block diagram view of a shunt voltage regulator as part of an apparatus according to an embodiment.

FIG. 1 is a block diagram view of a shunt voltage regulator according to an embodiment. An apparatus 10 includes a processor 12 that is disposed in a processor package 14. In one embodiment, the processor package 14 includes a ceramic material that is typically used to package a processor. In one embodiment, the processor package 14 includes an epoxy material. In one embodiment, the processor package 14 includes a combination of a ceramic and an epoxy.

A shunt, transient voltage regulator (hereafter "STVR") 16 is also disposed in the processor package 14. FIG. 1 also illustrates a decoupling capacitor 18 disposed between the processor 12 and the STVR 16. The decoupling capacitor 18 is represented schematically in FIG. 1. Although the decoupling capacitor 18 is depicted solely as being disposed between the processor 12 and the STVR 16, it may include a plurality of capacitor types that also may be disposed between the inductor 24 and the STVR 16, but still within the processor package 14 as set forth below. The STVR responds to transient loads for the processor 12.

FIG. 1 also illustrates a mounting substrate 20, wherein the processor package 14 is coupled to the mounting substrate 20 such as by an interposer (not pictured) and a power socket (not pictured). In one embodiment, the mounting substrate 20 is a printed circuit board (PCB) such as a motherboard or the like for a digital computer, or a PCB for a microelectronic device such as a video device, an audio device, or a game player. In another embodiment, the mounting substrate 20 is a card or the like for an expansion slot, wherein the processor 12 is a microelectronic device such as a processor or an application-specific integrated circuit (ASIC).

In addition to mounting substrate 20, a DC power converter voltage regulator 22 is disposed on the mounting substrate 20 and coupled to the processor 12 in series with the STVR 16. The DC power voltage regulator 22 is used among other things to convert higher voltage such as 48 V, 12 V, 5 V, and others to Vcc. Where processor 12 is a processor for a digital computer or the like, Vcc is in a range of about less than or equal to 3 V. In one embodiment, the Vcc is in a range from about 1 V to about 2 V. In one embodiment, Vcc is about 1.2 V. Additionally, at least one inductor 24 is depicted, as sometimes required and as is known in the art.

Figure 2:
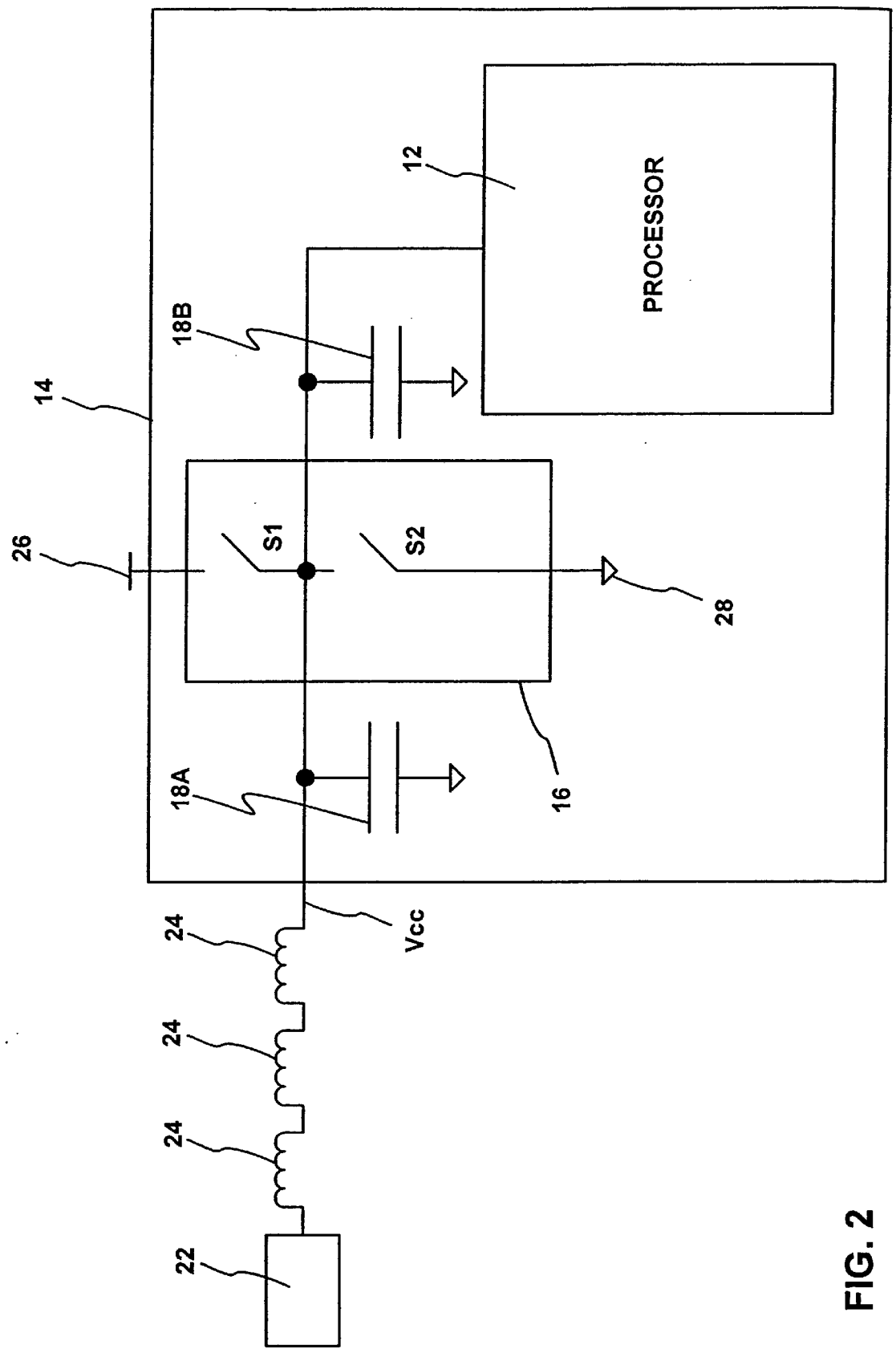
FIG. 2 is a schematic view of details of a shunt voltage regulator according to an embodiment.

FIG. 2 is another view of an embodiment. In one embodiment, the decoupling capacitor 18A includes a bulk capacitor, such as the type that is often mounted on a motherboard, near a processor or other device such as an ASIC. In one embodiment, the decoupling capacitor 18A includes a bulk capacitor and a high-frequency capacitor, such as the type that is also often mounted on a motherboard, near the processor. In one embodiment, the decoupling capacitor 18A includes a high-frequency capacitor alone, such as the type that is also often mounted on a motherboard, near the processor. In one embodiment, the decoupling capacitor 18A includes a high-frequency capacitor and a high-performance capacitor 18B such as a land-side capacitor (LSC) and/or a die-side capacitor (DSC). In one embodiment, the decoupling capacitor 18B includes at least one of a high performance capacitor such as an LSC and a DSC. In one embodiment, the decoupling capacitor functionality 18 includes a combination of any or all processor-proximate decoupling capacitor functionalities as set forth herein. Although the decoupling capacitors 18A and 18B are depicted as within the processor package 14, one embodiment includes the decoupling capacitor 18A as a bulk capacitor that is within the footprint of the processor package 14, but not contained therein, as set forth below.

In FIG. 2, one embodiment of an in-line STVR 16 is depicted as a first switch S1 and a second switch S2. In one embodiment, the first switch S1 and the second switch S2 are active semiconducting devices that are controlled by gated logic. The first switch S1, when closed, is coupled to an external voltage source. As such when closed, S1 forms an independent voltage source first shunt 26. In an embodiment that is applied to a processor 12 in the package 14, the independent voltage source first shunt 26 may have a voltage in a range from about 1 V to about 6 V. In one embodiment, the independent voltage source first shunt 26 has a voltage in a range from about 3 V to about 5 V. In one embodiment, independent voltage source first shunt 26 has a voltage of about 3.3 V. The second switch, S2, when closed, is coupled to ground and constitutes a ground second shunt 28.

The STVR 16 operates upon the principle of responding to transient processor loads. For example in one embodiment, processor 12 operates in a range from about 0.8 V to about 2 V and from about 40 Amps to about 100 Amps. In one embodiment, processor 12 operates at about 1.2 V and from about 50 Amps to about 60 Amps. It is noted that the potential and current may vary outside this range for other embodiment without departing from the scope of the embodiment.

As the amperage demand by the processor 12 increases such as by a step function, S1 closes, and additional current flows toward the processor 12 through the external voltage source first shunt 26. On the other hand, as the amperage demand by the processor 12 decreases such as by a different step function, S2 closes, and excess current flowing from Vcc is shunted to ground through the ground second shunt 28. Of course, when S1 is closed, S2 is open, and vice versa. In some instances, there are no processor transients. Where Vcc is the appropriate response to the processor 12, both S1 and S2 are open. In one embodiment, S1 and S2 operate on feedback loops (not pictured) that are independently powered for a fast feedback response. According to known technique, the gated logic that controls opening and closing of S1 and S2 is used to appropriately respond to processor transients.

In some embodiments, the presence of gated logic control of S1 and S2 is sufficient to respond to all processor transients. In other embodiments the various functionalities of the decoupling capacitor types 18A and 18B, as set forth herein, are tapped in concert with the STVR 16 to supply the processor 12 with sufficient current during some or all of its transients. Accordingly, the functionality that was previously accomplished by one or more bulk, high-frequency, and high-capacity decoupling capacitors on the motherboard, is contained in the combination of the STVR 16 and at least one of the decoupling capacitor types 18A and 18B as set forth herein.

In one embodiment, the STVR 16 and at least one of the decoupling capacitor types 18A and 18B are part of the processor package 14 such that the processor-transient response functionality is located significantly closer to the processor 12. According to this embodiment, a method embodiment includes responding to all processor transients with the functionality of at least one of the decoupling capacitor types 18A and 18B that are disposed in the processor package 14 as set forth herein.

It is noted that power loss is reduced because power no longer passes entirely across a variable control gate for responding to processor transients. The power loss across the series regulator always included dissipation of heat in close proximity with the processor. Accordingly, heat dissipation constituted both power loss and heat pollution near the processor that was not favorable.

According to an embodiment, a method is provided for minimizing power dissipation in an apparatus. The method includes providing a processor package 14 as set forth herein, and providing a DC voltage converter 22, spaced apart from the processor package 14. The method is completed by responding to transients by the STVR 16. In one embodiment of this method, a decoupling capacitance functionality of at least one of the decoupling capacitor types 18A and 18B is provided between the STVR 16 and the processor 12 as set forth herein. In another embodiment of this method, power dissipation is minimized, while operating at a steady state, by providing a dedicated power terminal from an external voltage for the STVR 16. In this way, steady state operation does not cause power dissipation across the series voltage regulator as in previously existing systems. The shunt embodiment in comparison to the series scheme results in a lower power dissipation.

Figure 3:
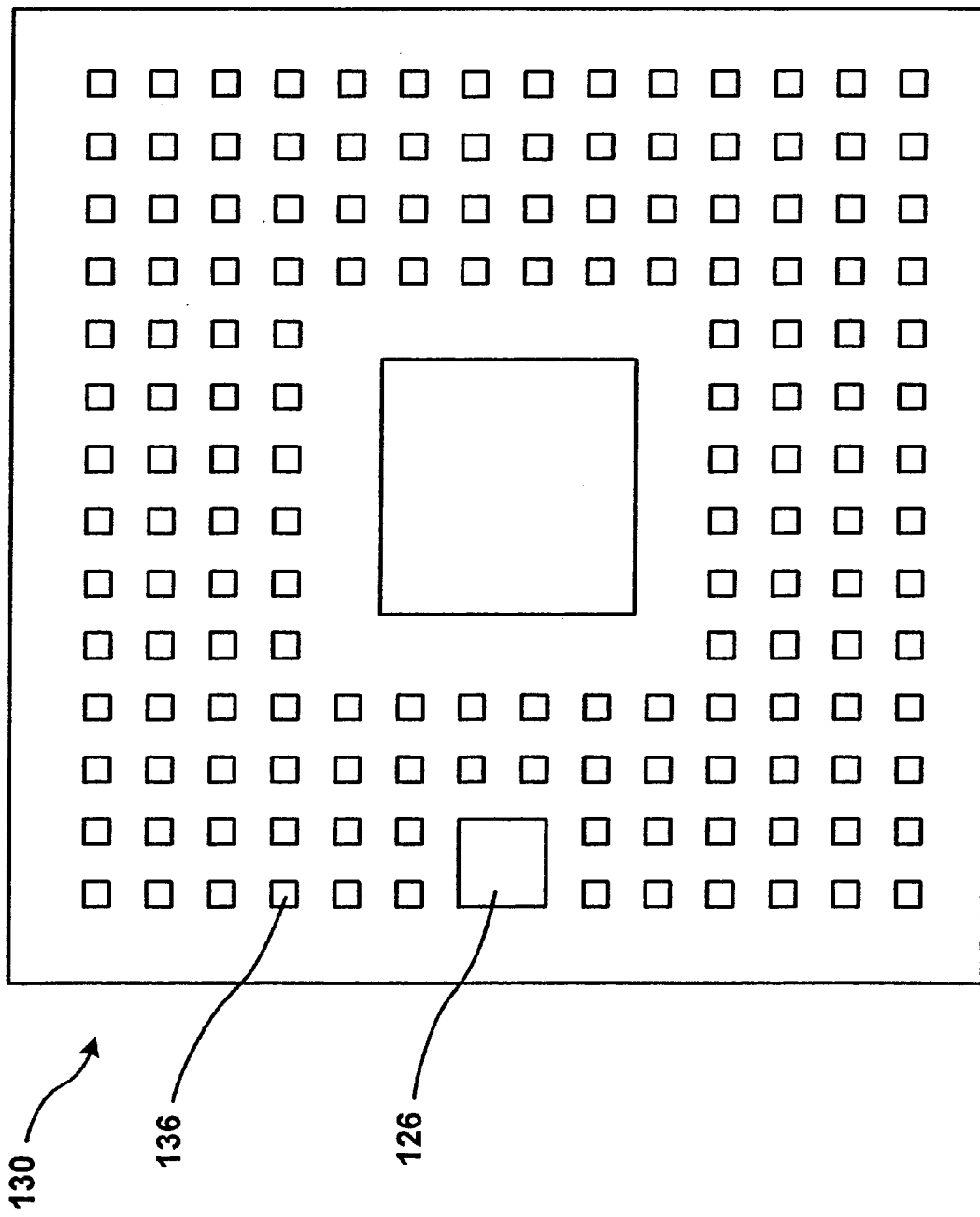
FIG. 3 is a top plan view of a power socket that includes a dedicated voltage source for a first shunt according to an embodiment.

FIG. 3 illustrates a power socket 130 that includes power and I/O pins 136. Further, a dedicated power terminal 126 that is the functionality, structure, or that communicates from the external voltage source first shunt 26 (FIGS. 1 and 2) is disposed in the power socket. In another embodiment, one of the power or I/O pins 136 or a plurality of them, acts as the external voltage first shunt. As set forth herein, some embodiments include the use of an LSC or a DSC, or both, within the processor package to assist in addressing processor transients.

Figure 4B:
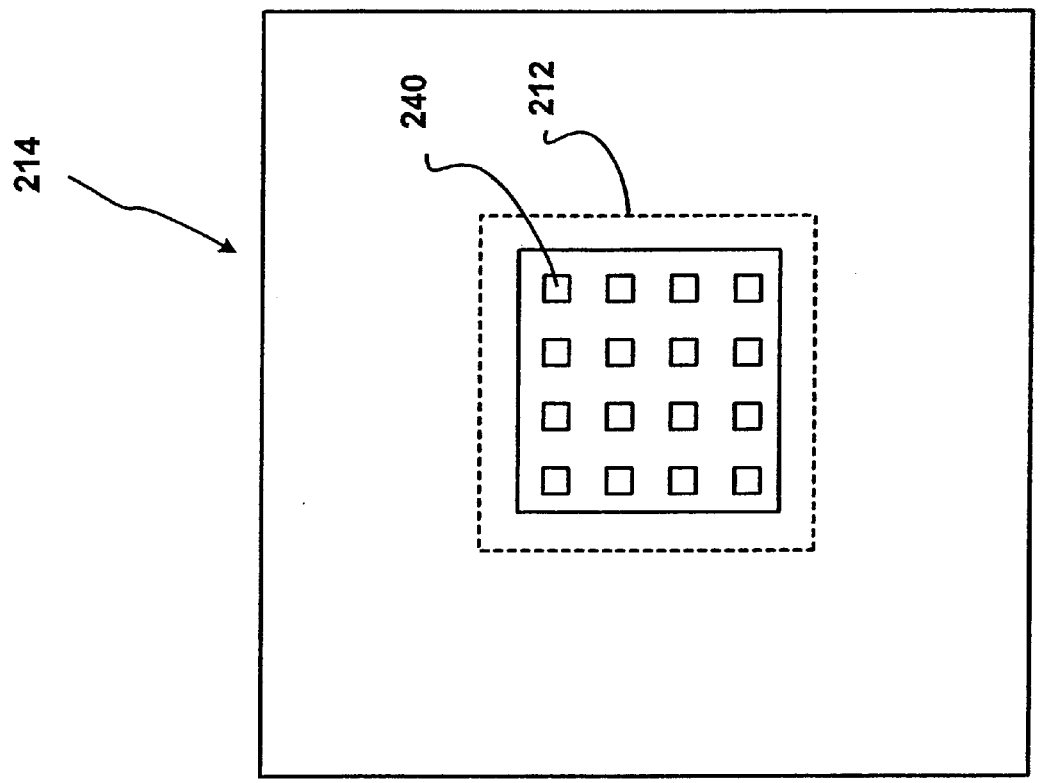
FIG. 4B is a bottom plan view of a processor package that includes a land-side capacitor according to an embodiment.
Figure 4A:
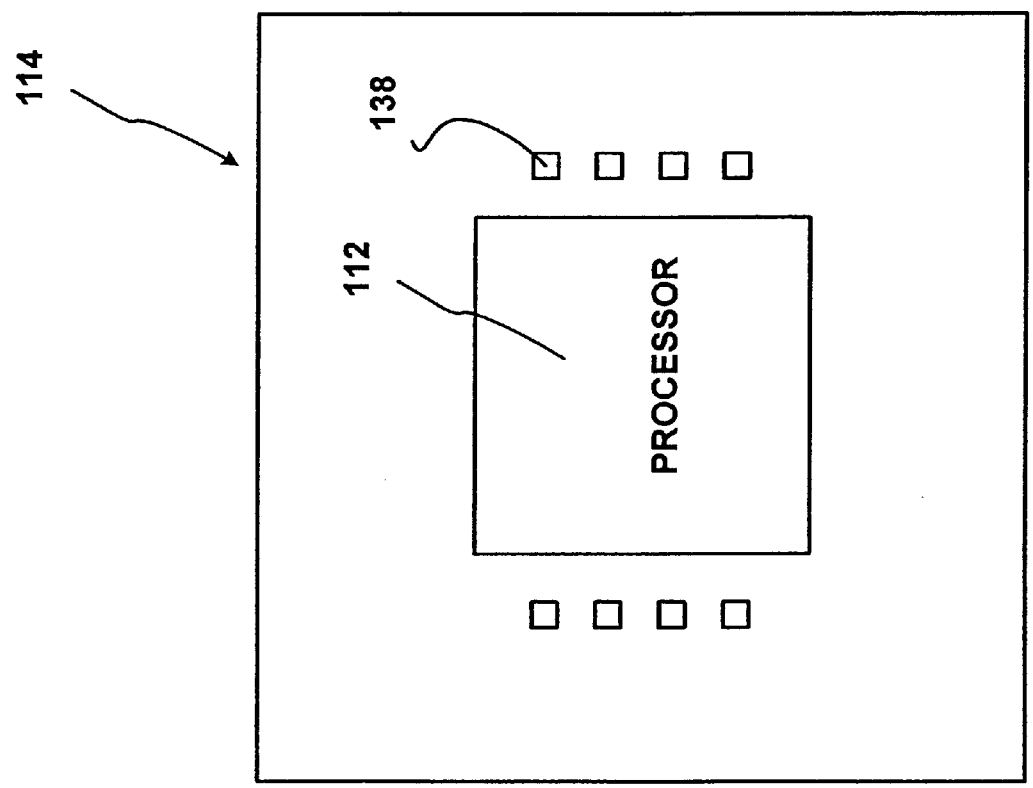
FIG. 4A is a top plan view of processor package that includes a die-side capacitor according to an embodiment.

FIG. 4A is a top plan view of a processor package 114 that includes a processor 112 and a DSC 138 (a plurality in some embodiments) according to an embodiment.

FIG. 4B is a bottom plan view of a processor package 214 that includes processor 212 and an LSC 240 (a plurality in some embodiments) according to an embodiment. In one embodiment, it is noted that a processor package has both the DSC 138 functionality (a plurality in some embodiments) and the LSC 240 functionality (a plurality in some embodiments).

Although the general decoupling capacitor functionality 18 (FIGS. 1 and 2) is depicted solely as being disposed between the processor 12 and the STVR 16, it may also be disposed between the inductor 24 functionality and the STVR 16 (FIG. 2), but still within the processor package 14. Optionally, a decoupling capacitor functionality 18A is disposed in a structure that is external to the processor package such as in an interposer. Additionally, it is noted that the components are coupled in parallel in one embodiment.

FIG. 5A is an elevational view of another embodiment. In FIG. 5, an interposer 342 includes a decoupling capacitor 344 according to an embodiment. The interposer 342 is intended to be disposed between the processor package (not pictured) and the DC voltage converter (FIGS. 1 and 2). In one embodiment, the decoupling capacitor 344 includes the functionality of a bulk capacitor according to known technique. In one embodiment, the decoupling capacitor 344 has the functionality of a high-frequency capacitor according to known technique. In one embodiment, the interposer 342 and the processor package 314, such as processor package 14 (FIGS. 1 and 2), processor package 114 (FIG. 4A), or processor package 214 (FIG. 4B) are an integral unit.

FIG. 5B is an elevational view of an interposer including a decoupling capacitor and a shunt, transient voltage regulator according to an embodiment. In this embodiment, the decoupling capacitor 344 is accompanied by the STVR 316 within the interposer 342.

FIG. 6 is an elevational view of an apparatus 310 according to an embodiment. The apparatus 310 includes a processor 312, depicted in phantom lines, a processor package 314, and a STVR 316, also depicted in phantom lines. The apparatus 310 also includes a mounting substrate 320, a DC voltage regulator 322. Incidental inductive effect within board traces is depicted as item 324. Additionally, incidental resistive effect is also depicted as item 324. Consequently, the incidental impedance is depicted as item 324. As set forth herein, the DC voltage regulator 322 is coupled to the processor 312 in series with the STVR 316.

In another embodiment, the interposer 342 occupies substantially the same footprint on a mounting substrate 320 (refer to FIG. 6) as the processor package, such as processor package 14, processor package 114, or processor package 214. With these embodiments disclosed, it becomes apparent that the STVR 316 depicted in the process or package 314 in FIG. 6, may alternatively be disposed within the interposer 342.

The apparatus 310 also includes a power socket 330 that is disposed between the processor package 314 and the mounting substrate 320. The interposer 342, in one embodiment, includes a decoupling capacitor 344. In one embodiment, the interposer 342 is an integral part of the processor package 314.

It is also noted that a dedicated power terminal 326 is depicted in phantom lines within the power socket 330 that is the functionality, structure, or that communicates from an external voltage source first shunt such as the external voltage source first shunt 26 depicted in FIGS. 1 and 2.

Figure 7:
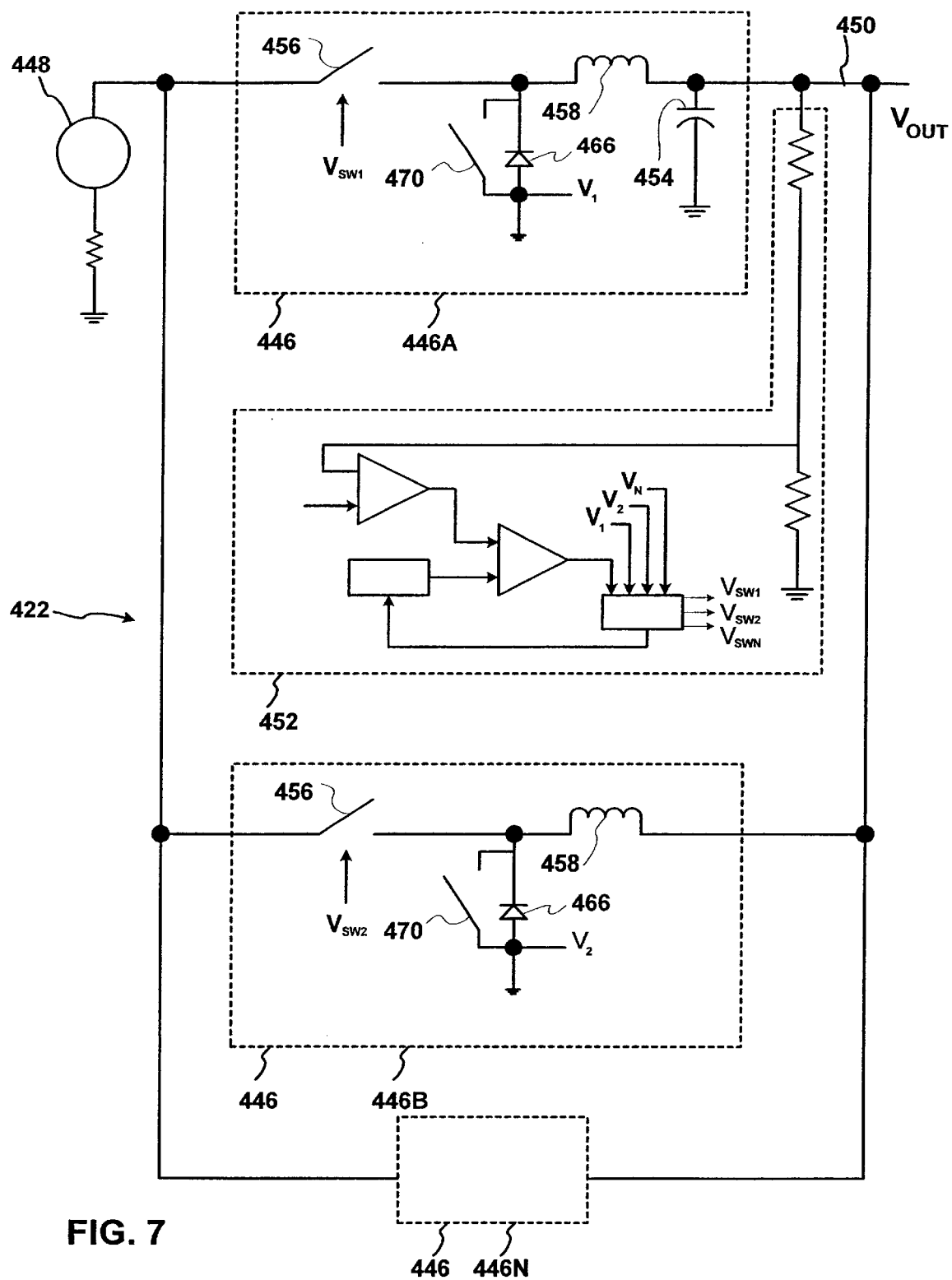
FIG. 7 is a schematic view a board-mounted DC voltage converter according to an embodiment.

FIG. 7 is a schematic view of a DC voltage converter 422, such as the DC voltage converter 22 depicted in FIGS. 1 and 2, according to an embodiment. According to a method embodiment, at least one voltage input is converted to Vcc. The DC voltage converter 422 is typically spaced apart from a processor package such as processor package 14 (FIGS. 1 and 2), or processor package 114 (FIG. 4A), or processor package 214 (FIG. 4B) or processor package 314 (FIG. 6). Typically, voltages such as 48 V, 12 V, 5 V, and others are converted to Vcc.

In accordance with an embodiment, the DC voltage converter 422 includes two Buck 446 switching regulator stages 446A and 446B that are coupled in parallel to convert an input voltage $V_{IN}$ into an output voltage $V_{OUT}$. In this manner, the stages 446A and 446B each receive the $V_{IN}$ input voltage from a voltage source 448 and regulate the $V_{OUT}$ voltage that appears at an output terminal 450 that is common to both of the stages 446A and 446B. The stages 446A and 446B also share a controller 452 and a bulk capacitor 454 that is coupled between the output voltage terminal 450 and ground.

In some embodiments, each Buck switching regulator stage 446 includes a switch 456 such as a metal-oxide-semiconductor field-effect-transistor (MOSFET), for example, that is coupled between the positive terminal of the voltage source 448 and a terminal of an inductor 458. The other terminal of the inductor 458 is coupled to the output voltage terminal 450. For the stage 446A, the switch 456 is closed and opened by a signal called $V_{SW1}$ that originates in the controller 452, and for the stage 446B, the switch 456 is closed and opened by a signal called $V_{SW2}$. For each stage 446A and 446B, the closing of the switch 456 causes energy to be transferred from the voltage source 448 and stored in the inductor 458 to energize the inductor 458. Opening of the switch 456 causes the stored energy to be transferred from the inductor 458 to the output voltage terminal 450, either through closing switch 470 or flowing through the diode 466. This transfer de-energizes the inductor 458. Meanwhile, the current also flows to the output voltage terminal 450.

In some embodiments of the invention, the controller 452 directs the $V_{SW1}$ and $V_{SW2}$ signals in a manner that, in general, causes the "on" times (the times in which the switch 456 conducts or is closed) of the two switches 456 to be shifted 180° apart. In other embodiments, the DC voltage regulator 422 is a multiphase regulator other than a two-phase regulator. Accordingly, the controller 452 may generate signals to control the operation of the stages so that the switch control signals have the proper phase relationship. Examples include a three-phase regulator wherein the switch control signals are 120° apart, a four-phase regulator wherein the switch control signals are 90° apart, etc.

FIG. 7 also depicts up to an N-phase regulator 446N. An advantage of one embodiment is that the DC voltage converter is optimized without requiring co-fabrication and co-optimization of an AC voltage regulator. An advantage of another embodiment is that the STVR is optimized during its design and production without requiring co-fabrication and co-optimization of a DC voltage converter. By these embodiments, separately optimized components are assembled to achieve improved fabrication and assembly yields. For example the STVR on the package can carry a significant share of the transient response functionality. It consequently relieves the extra duty of the DC voltage converter 422. This in turn can have an effect such that a smaller capacitor 454 is required. The DC voltage converter 422 can switch more slowly, which relates to a higher efficiency of operation.

The controller 452 is operated to respond to various transients according to the clock cycle. Such control schemes are known to one of ordinary skill in the art. Such control schemes include PWM control and others as are known in the art. In some embodiments of the invention, the controller 452 regulates the $V_{OUT}$ voltage by using a constant-frequency PWM control technique to control the duty cycle of the two switches 62, except when a transient occurs.

Referring again to FIG. 7, among the other features of each Buck converter stage 446A and 446B, each stage 446 includes a diode 466 that has its cathode coupled to the inductor terminal that is closest to the switch 456. The anode of the diode 466 is coupled to ground. In some embodiments of the invention, each stage 446 includes the switch 470 that is coupled in parallel with the diode 466 and may be used to reduce resistive power losses in the stages 446A and 446B.

Figure 8:
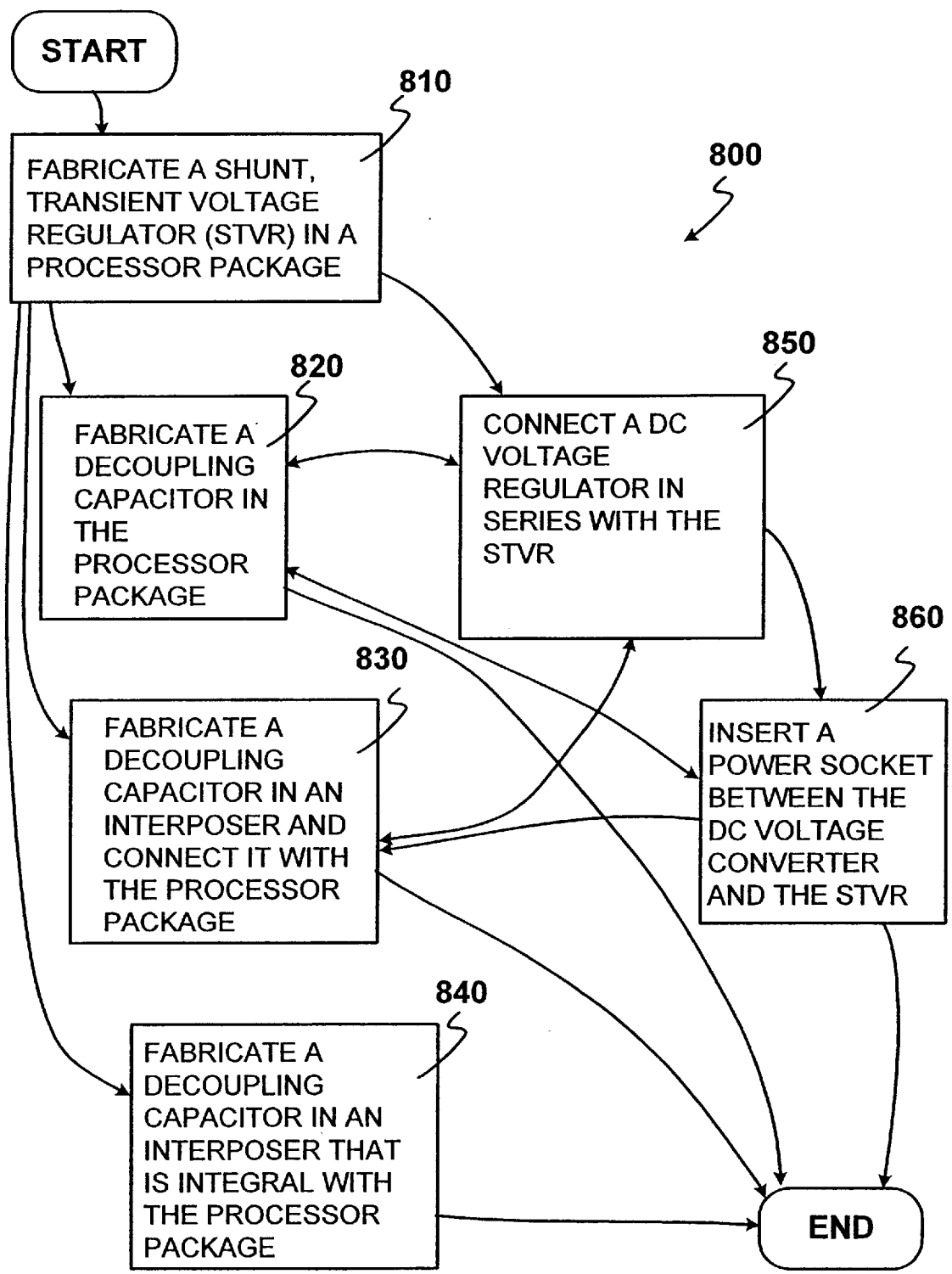
FIG. 8 is a method flow diagram according to an embodiment.

FIG. 8 is a method flow diagram 800 according to an embodiment. The method embodiments relate to fabricating system and structure embodiments of the apparatus. According to the method embodiments, increased processor package yield is achieved. 810 includes fabricating STVR in a processor package. In one embodiment, 820 includes fabricating at least one decoupling capacitor functionality in the processor package. In one alternative embodiment, 830 includes fabricating a decoupling capacitor functionality in an interposer, and optionally coupling it with the processor package. In another alternative embodiment, 840 includes fabricating a decoupling capacitor functionality in an interposer that is integral with the processor package.

According to an embodiment, the method 850 includes coupling in series a DC voltage converter to the STVR on the mounting substrate for the processor package. According to another embodiment, the method 860 includes inserting a power socket between the DC voltage converter and the STVR. It is noted that several processing paths are depicted in FIG. 8 that represent choices for a given application.

With reference again to FIG. 1, according to this method embodiment, and because of the structures and systems in this disclosure, the processor package (such as processor package 14, by way of non-limiting example) is simplified. According to one embodiment in a processor package 14, a STVR 16 is fabricated. According to another embodiment, a mounting substrate 20 is provided for the processor package 14, and a DC voltage converter 22 is coupled in series to the STVR 16 that is encapsulated in the processor package 14. In another method embodiment, a decoupling capacitor 18 is fabricated in the processor package 14.

As set forth herein, the decoupling capacitors 18A and 18B (FIG. 2) include either or both a high-frequency capacitor and a high-performance capacitor 344 (FIG. 6) such as a DSC or an LSC. In another embodiment, a decoupling capacitor 344 is fabricated in an interposer that is optionally integral with the processor package 314. In one embodiment, the decoupling capacitor 344 is a bulk capacitor, the capacitor 18A is a high-frequency capacitor, and the capacitor 18B is a high-performance capacitor.

Another embodiment of the present invention relates to a method of minimizing power dissipation in an apparatus. The method includes providing a processor package according to various embodiments and equivalents as set forth herein. The method also includes providing a DC voltage converter that is spaced apart from the processor package according to the various embodiments as set forth herein. In an embodiment, the method of minimizing power dissipation includes responding to transients by the STVR, such as STVR 16 depicted in FIG. 1. In another embodiment, the method includes providing a decoupling capacitance functionality between the STVR and the processor.

The method of minimizing power dissipation may also include an embodiment that includes providing a decoupling capacitance functionality between the DC voltage converter and the STVR. In this embodiment, decoupling capacitance functionality is included in the processor package, in the interposer, or both, including an embodiment wherein the interposer and the processor package are optionally an integral unit.

In another embodiment, the method of minimizing power dissipation in an apparatus includes providing a power socket that includes a dedicated power terminal for the STVR. In another embodiment, the power for the STVR is supplied from a power I/O pin or a plurality of them.

It is emphasized that the Abstract is provided to comply with 37 C.F.R. §1.72(b) requiring an Abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description of Embodiments of the Invention, with each claim standing on its own as a separate preferred embodiment.

It will be readily understood to those skilled in the art that various other changes in the details, material, and arrangements of the parts and method stages which have been described and illustrated in order to explain the nature of various embodiments of this invention may be made without departing from the principles and scope thereof as expressed in the subjoined claims.

What is claimed is:

1. An apparatus comprising:

a processor in a processor package; and a shunt, transient voltage regulator (STVR) in the processor package and coupled to the processor.

2. The apparatus according to claim 1, further including:

a decoupling capacitor coupled between the processor and the STVR.

3. The apparatus according to claim 1, further including:
at least one decoupling capacitor coupled between the processor and the STVR, wherein the at least one decoupling capacitor is selected from a land-side capacitor, a die-side capacitor, and a combination thereof.

4. The apparatus according to claim 1, further including:
an interposer coupled to the processor package; and
a decoupling capacitor in the interposer.

5. The apparatus according to claim 1, further including:
an interposer coupled to the processor package;
a first decoupling capacitor having a first capacitance functionality in the interposer; and
coupled between the processor and the STVR, a second decoupling capacitor having a second capacitance functionality that is different from the first capacitance functionality.

6. The apparatus according to claim 1, further including:
an interposer that is integral with the processor package;
a first decoupling capacitor having a first capacitance functionality in the interposer; and
coupled between the processor and the STVR, a second decoupling capacitor having a second capacitance functionality different from the first capacitance functionality.

7. The apparatus according to claim 1, further including:
a mounting substrate, wherein the processor package is coupled to the mounting substrate; and
a DC power converter voltage regulator coupled to the processor in series with the STVR.

8. The apparatus according to claim 1, further including:
a mounting substrate, wherein the processor package is coupled to the mounting substrate;
a power socket between the processor and the mounting substrate; and
a DC power converter voltage regulator on the mounting substrate and coupled to the processor in series with the STVR.

9. The apparatus according to claim 8, further including:
a mounting substrate, wherein the processor package is coupled to the mounting substrate; and
a DC power converter voltage regulator coupled to the processor in series with the STVR, wherein the DC power converter voltage regulator is optimized for DC power conversion.

10. The apparatus according to claim 1, wherein the STVR is optimized for responding to a processor load transient.

11. An apparatus comprising:
a processor package including:
a processor; and
a shunt, transient voltage regulator (STVR);
a mounting substrate, wherein the processor is coupled to the mounting substrate; and
a DC power converter coupled in series with the STVR, to the processor.

12. The apparatus according to claim 11, further including:
coupled between the processor and the STVR, a decoupling capacitor.

13. The apparatus according to claim 11, further including:
an interposer coupled to the processor package;
in the interposer, a first decoupling capacitor having a first capacitance functionality; and
coupled between the processor and the STVR, a second decoupling capacitor having a second capacitance functionality that is different from the first capacitance functionality.

14. The apparatus according to claim 11, further including:
between the processor and the mounting substrate, a power socket; and
coupled between the processor and the STVR, a decoupling capacitor in an interposer.

15. A method comprising:
operating a processor in a processor package; and
with a shunt, transient voltage regulator (STVR) in the processor package, responding to transient loads of the processor.

16. The method according to claim 15, wherein the STVR is operated with an independent voltage source first shunt, and a ground second shunt.

17. The method according to claim 15, further including:
with a DC voltage converter spaced apart from the processor package, converting at least one voltage input to Vcc.

18. The method according to claim 15, further including:
responding to all processor transients with decoupling capacitor functionality selected from a second decoupling capacitor in the processor package, a first decoupling capacitor in an interposer that is coupled to the processor package, a first decoupling capacitor in an interposer that is integral with the processor package, and a combination thereof.

19. The method according to claim 15, wherein the STVR includes an independent voltage source first shunt and a ground second shunt, and further including:
controlling the first shunt and the second shunt by gated logic.

20. A method comprising:
inserting a shunt, transient voltage regulator (STVR) in a processor package.

21. The method according to claim 20, further including:
on a mounting substrate for the processor package, coupling in series a DC voltage converter to the STVR.

22. The method according to claim 20, wherein the STVR includes an independent voltage source first shunt, and a ground second shunt.

23. The method according to claim 20, further including:
fabricating a decoupling capacitor in the processor package.

24. The method according to claim 20, further including:
fabricating a decoupling capacitor in an interposer that is integral with the processor package.

25. The method according to claim 20, further including:
between the DC voltage converter and the STVR, inserting a power socket.

26. A method of minimizing power dissipation in an apparatus, comprising:
operating a processor in a processor package, that consists essentially of:
a processor; and
a shunt, transient voltage regulator (STVR);
operating a DC voltage converter spaced apart from the processor package; and
responding to processor transients by the STVR.

27. The method according to claim 26, further including:
providing decoupling capacitance functionality between the STVR and the processor.

28. The method according to claim 26, further including:
providing a power socket and a dedicated power terminal therein from an external voltage for the STVR.

* * * * *